(12) United States Patent
Lee

(10) Patent No.: US 6,599,821 B2
(45) Date of Patent: Jul. 29, 2003

(54) METHOD FOR FABRICATING CONDUCTIVE LINE PATTERN FOR SEMICONDUCTOR DEVICE

(75) Inventor: Byung Hak Lee, Choongcheongbuk-Do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 46 days.

(21) Appl. No.: 09/793,567

(22) Filed: Feb. 27, 2001

(65) Prior Publication Data

US 2001/0018259 A1 Aug. 30, 2001

(30) Foreign Application Priority Data

Feb. 29, 2000 (KR) ........................................ 2000-10090

(51) Int. Cl.$^7$ ................. H01L 21/3205; H01L 21/4763
(52) U.S. Cl. ...................... 438/592; 438/585; 438/595; 438/624; 438/652; 438/197; 438/618
(58) Field of Search .................. 438/585, 592, 438/593, 618, 622, 655, 652, 624, 669, 663, 664, 197, 211, 275, 279, 595

(56) References Cited

U.S. PATENT DOCUMENTS

| | | | | |
|---|---|---|---|---|
| 5,907,188 A | * | 5/1999 | Nakajima et al. | 257/751 |
| 5,923,999 A | * | 7/1999 | Balasubramanyam et al. | 438/592 |
| 6,037,639 A | * | 3/2000 | Ahmad | 257/401 |
| 6,162,741 A | * | 12/2000 | Akasaka et al. | 438/773 |
| 6,165,883 A | * | 12/2000 | Hiura | 438/592 |
| 6,236,093 B1 | * | 5/2001 | Hiura | 257/413 |
| 6,306,743 B1 | * | 10/2001 | Lee | 438/592 |
| 6,340,629 B1 | * | 1/2002 | Yeo et al. | 438/592 |

* cited by examiner

Primary Examiner—Amir Zarabian
Assistant Examiner—Maria Guerrero
(74) Attorney, Agent, or Firm—Morgan, Lewis & Bockius LLP

(57) ABSTRACT

A method for fabricating a conductive line pattern for a semiconductor device including the steps of: forming a gate insulation film on the upper surface of a semiconductor substrate; forming a polysilicon layer on the upper surface of the gate insulation film; forming a WNx film on the upper surface of the polysilicon layer; forming a first insulation film on the upper surface of the WNx film; patterning the first insulation film, the WNx film and the polysilicon layer, to form a conductive line pattern; and selectively oxidizing the polysilicon layer. With the method, in view of forming the conductive line pattern in the WNx/poly-Si structure, the thermal treatment processes are reduced in number, so that the thermal stress applied to the conductive line pattern is diminished, and thus, a reliability of the semiconductor device is improved. In addition, as the thermal treatment processes are reduced in number, the processes are simplified, and accordingly a time required for fabricating the conductive line pattern of the semiconductor is decreased.

19 Claims, 2 Drawing Sheets

METHOD FOR FABRICATING CONDUCTIVE LINE PATTERN FOR SEMICONDUCTOR DEVICE

BACKGROUND OF THE INVENTION

1. Field of the Invention

The present invention relates to a semiconductor device, and more particularly to a method for fabricating a conductive line pattern for a semiconductor device having a low sheet resistance, which is requisite for implementation of a high speed and highly integrated semiconductor device.

2. Description of the Background Art

As a semiconductor device is highly integrated more and more, a conductive line, and especially, the width of a gate electrode becomes narrower. Accordingly, as the width of the conductive line is reduced, its resistance is increased, which causes RC delay in the conductive line of the gate electrode.

RC delay in the conductive line of the gate electrode is a big obstacle to a market in which a device operated at a high speed is desperately required. Therefore, manufacturers of semiconductor devices have conducted much research in order to meet the requirement of the market.

Recently, as low resistance gate electrode structures, there have been proposed a W/WNx/poly-Si (poly-Si refers to a polycrystalline silicon layer), a W/TiN/poly-Si or a W/poly-Si structure. Among them, a gate electrode in the W/WNx/poly-Si structure is notable with its advantage in that its sheet resistance is lower by 40% than the W/TiN/poly-Si structure.

Nonetheless, the gate electrode in the W/WNx/poly-Si structure has the following problems. The WNx formed, as a barrier film is a thermally unstable material. Thus, if a following thermal process at a temperature of more than 800° C. is performed, its characteristics as a barrier film are destroyed, leading to a silicide reaction of tungsten and polysilicon. Accordingly, the resistance is rapidly increased and characteristics of a gate insulation film are easily degraded.

In order to improve such shortcomings, an amorphous WN/poly-Si structure of a gate electrode was also proposed.

As an example of a method for fabricating a gate electrode of the conventional art, a method for fabricating the WNx/poly-Si gate electrode structure will now be described.

First, as shown in FIG. 1A, a silicon oxide film 101 having a thickness of 65 Å, that is, a gate insulation film, is formed on the upper surface of a semiconductor substrate 100 by a thermal oxidation. Next, a polysilicon layer 102 having a thickness of 1000 Å is formed on the upper surface of the silicon oxide film 101 by a low pressure chemical vapor deposition (LPCVD), to which an impurity ion is injected. And then, a WNx film 103 having a thickness of 1000 Å is deposited on the upper surface of the polysilicon layer 102.

The obtained structure of FIG. 1A is subject to a rapid thermal treatment annealing at the temperature of 800~1000° C. As the annealing is performed, the WNx film 103 is changed to a W film 103a, and a barrier film 105 having a thickness of about 1 nm is formed on the interface of the W film 103a and the polysilicon layer 102.

The barrier film 105 is a silicon nitride obtained as nitride of the WNx film is diffused to the polysilicon layer 102, its under layer, and mixed with the silicon.

The reason why the WNx film 103 was changed to the W film 103a is as follows. At the temperature of more than 800° C., WNx becomes thermally unstable so that it is easily separated to W and N. Part of the separated N is diffused to the polysilicon layer, its under layer, and the remaining nitrogen is dispersed in the air. Accordingly, the WNx film is changed to the W film Next, as shown in FIG. 1C, the W film 103a, the barrier film 105, the polysilicon layer 102 and the silicon oxide film 101 are selectively etched by using a photoresist mask, so as to form a gate electrode pattern 106.

And, as shown in FIG. 1D, the structure of FIG. 1C is thermally treated at an atmosphere of $H_2O/H_2$ to selectively oxidize the polysilicon layer 102 and the silicon substrate 100, thereby forming an oxide film 107. At this time, the marginal portion of the gate insulation film 101 under the polysilicon layer 102 is thick. Consequently, the marginal portion of the gate electrode to which electric field is concentrated is prevented from destroying.

However, the method for fabricating the gate electrode of the conventional art has the following problems.

When performing the step of annealing the WNx/poly-Si layer at the temperature of more than 800° C. to change it to W/SiN/poly-Si layer, the step of patterning the multi-layer of W/SiN/poly-Si to form the gate electrode pattern, and the step of performing the oxidation process of more than 800° in order to oxidize the polysilicon layer of the gate electrode pattern, the high temperature thermal treatments are performed twice. Thus, due to the repeatedly performed high temperature thermal treatments, the multi-layer conductive line film receives a thermal stress, resulting in the degradation of the reliability of the semiconductor device using such conductive line.

SUMMARY OF THE INVENTION

Therefore, an object of the present invention is to provide a method for fabricating a conductive line pattern suitable for a high speed and highly integrated device.

Another object of the present invention is to provide a method for fabricating a conductive line pattern having a low sheet resistance.

Still another object of the present invention is to provide a method for fabricating a conductive line pattern of a semiconductor device that is capable of reducing the number of thermal treatment processes thereby improving the reliability of a semiconductor device.

To achieve these and other advantages and in accordance with the purpose of the present invention, as embodied and broadly described herein, there is provided a method for fabricating a conductive line pattern for a semiconductor device including the steps of: forming a first insulation film on the upper surface of a semiconductor substrate; forming a polysilicon layer on the upper surface of the first insulation film; forming a WNx film on the upper surface of the polysilicon layer; forming a second insulation film on the upper surface of the WNx film; patterning the second insulation film, the WNx film and the polysilicon layer, to form a conductive line pattern; and selectively oxidizing the polysilicon layer.

According to the method for fabricating a conductive line pattern for a semiconductor device, the step of selectively oxidizing the polysilicon layer is performed in a manner that the semiconductor substrate is thermally treated at a temperature of 800~1000° C. by using a mixture of gases of $H_2O/H_2$ or a carrier gas of argon or nitrogen.

According to the method for fabricating a conductive line pattern for a semiconductor device, a partial pressure ratio of the mixture of gases of $H_2O/H_2$ is in the range of $1\times10^{-6}$~10.

According to the method for fabricating a conductive line pattern for a semiconductor device, during the selective oxidation, the WNx film is changed to a W film.

According to the method for fabricating a conductive line pattern for a semiconductor device, in the step of forming the WNx film, the WNx film is formed by a reactive sputtering at an atmosphere of mixture of gases that the ratio of $N_2/(N_2+Ar)$ is 0.4.

According to the method for fabricating a conductive line pattern for a semiconductor device, in the step of forming the WNx film, a content of N of the WNx film is in the range of 5~55%.

The method for fabricating a conductive line pattern for a semiconductor device further includes the steps of: forming a third insulation layer on the upper surface of the conductive line pattern and of the semiconductor substrate; and anisotropic-etching the third insulation layer, to form a side wall spacer at the side wall of the conductive line pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A through 2D illustrate processes of method for fabricating a gate electrode of a semiconductor device in accordance with the present invention.

Figure 1A:
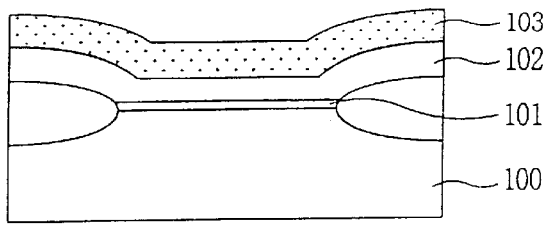
FIGS. 1A through 1D illustrate processes of method for fabricating a gate electrode of a semiconductor device in accordance with a conventional art.
Figure 1B:
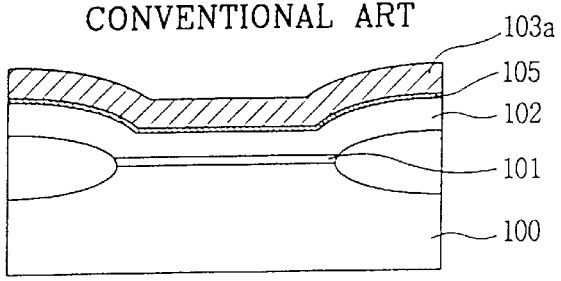
Figure 1C:
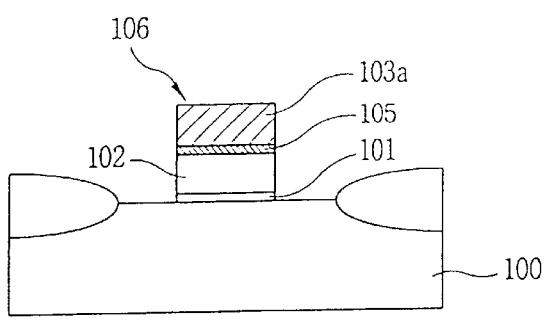
Figure 1D:
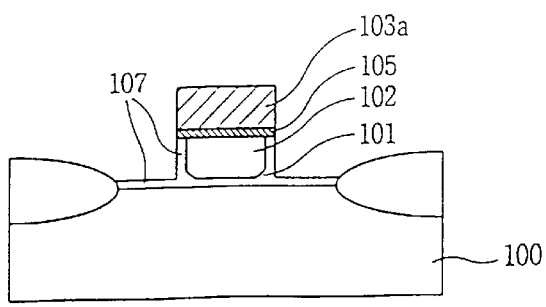
Figure 2A:
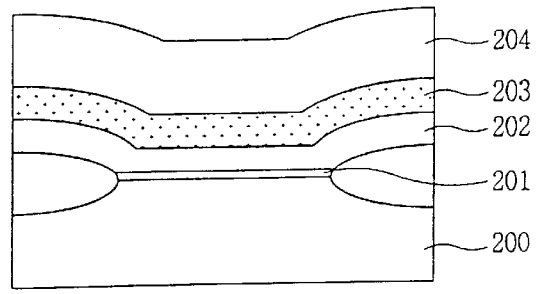
FIGS. 2A through 2D illustrate processes of method for fabricating a gate electrode of a semiconductor device in accordance with the present invention.

First, as shown in FIG. 2A, a gate insulation film 201, or first insulation film, having a thickness of 30~80 Å is formed on a semiconductor substrate 200 by a thermal oxidation. The gate insulation film 201 is preferably made of a silicon oxide film ($SiO_2$) or a silicon nitride film ($Si_3N_4$).

Next, a polysilicon layer 202 doped with one of ions of As, P, B or Bf2 is deposited with approximately 1000 Å thickness by a low-pressure chemical vapor deposition.

An amorphous WNx film 203 having a thickness of approximately 1000 Å is deposited on the upper surface of the polysilicon layer 202. The WNx film 203 is formed by reactive sputtering in an atmosphere of a mixture of gases of which the ratio of $N_2/(N_2+Ar)$ approximately equals to 0.4. The ratio of the nitrogen (N) of the WNx film is preferably 5~55%.

Then, a second insulation film 204 is formed on the upper surface of the WNx film 203. Silicon nitride film (Si3N4) or a silicon oxide film (SiO2) forms the first insulation film.

Figure 2B:
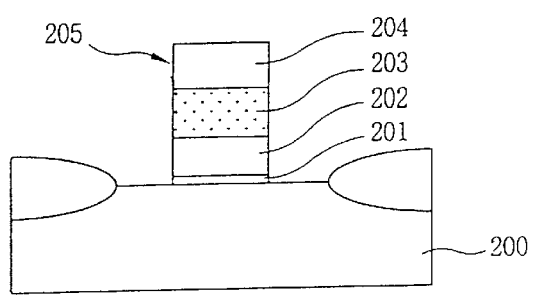

Next, as shown in FIG. 2B, the second insulation film 204, the WNx film 203, the polysilicon film 202 and the gate insulation film 201 are selectively etched by using the photoresist pattern, to form a gate electrode conductive line pattern 205.

Figure 2C:
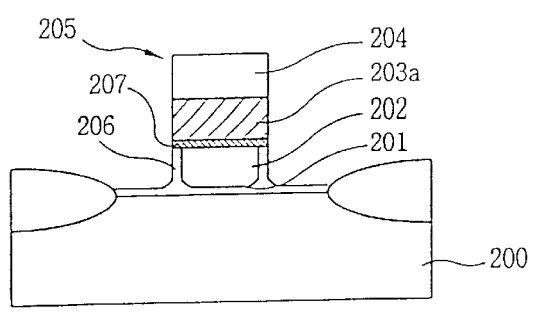

And, as shown in FIG. 2C, in order to restore the gate insulation film 201 and the polysilicon layer 202 damaged during the etching, the gate electrode conductive line pattern 205 is selectively oxidized.

During the oxidation process, an oxide film 206 is formed on the upper surface of the semiconductor substrate 200 and on the side wall of the polysilicon layer 202. Also, the marginal portion of the gate insulation film 201 under the gate electrode conductive line pattern 205 becomes thick, so that a dielectric breakdown withstand pressure of the gate insulation film is strengthened over the electric field concentration.

The selective oxidation process is performed by carrying out a rapid thermal treatment annealing for 10 seconds~180 seconds at an atmosphere of a mixture of gases of $H_2O/H_2$ at the temperature of about 800~1000°. At this time, argon (Ar) or nitrogen ($N_2$) is used as a carrier gas. In the annealing process, a partial pressure ratio of the $H_2O/H_2$ gas is in the range of $1\times10^{-6}$~10, and the more preferable partial pressure is 0.1.

That is, the selective oxidation process and the rapid thermal treatment annealing process for changing the WNx film to the W film are simultaneously performed, which was separately performed in the conventional art.

Accordingly, while the selective oxidation process is being performed, nitrogen escapes the WNx film, and the WNx film 203 is changed to the W film 203a having a low resistance and a thin barrier film 207 is formed on the interface of the W film 203a and the polysilicon layer 202.

Figure 2D:
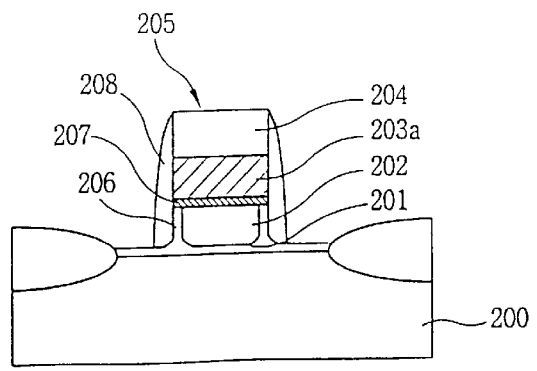

Finally, as shown in FIG. 2D, a third insulation layer is formed on the upper surface of the whole structure obtained as shown in FIG. 2C. Thereafter, anisotrophic etching is wholly performed without any etching mask pattern, so as to form a side wall spacer 208 at the side wall of the gate electrode conductive pattern 205, thereby completing the processes of the method for fabricating the conductive line pattern for a semiconductor device.

As so far described, according to the method for fabricating the conductive line pattern, in view of forming the conductive line pattern in the WNx/poly-Si structure, the thermal treatment processes are reduced in number, so that the thermal stress applied to the conductive line pattern is diminished, and thus, a reliability of the semiconductor device is quite improved.

In addition, as the thermal treatment processes are reduced in number, the processes are simplified, and accordingly a time required for fabricating the conductive line pattern of the semiconductor is shortened.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore, all changes and modifications that fall within the meets and bounds of the claims or equivalence of such meets and bounds are intended to be embraced by the appended claims.

What is claimed is:

1. A method for fabricating a conductive line pattern for a semiconductor device, comprising the steps of:

forming a first insulation film on the upper surface of a semiconductor substrate;

forming a polysilicon layer on the upper surface of the first insulation film;

forming a WNx film on the upper surface of the polysilicon layer;

forming a second insulation film on the upper surface of the WNx film;

patterning the second insulation film, the WNx film and the polysilicon layer, to form a conductive line pattern; and selectively oxidizing the polysilicon layer.

2. The method according to claim 1, wherein, during the step of selectively oxidizing the polysilicon layer, the semiconductor substrate is thermally treated at a temperature of 800~1000° C. by using a mixture of gases of $H_2O/H_2$ or a carrier gas of argon or nitrogen.

3. The method according to claim 2, wherein a partial pressure ratio of the mixture of gases of $H_2O/H_2$ is in the range of $1\times10^{-6}$~10.

4. The method according to claim 1, wherein, during the step of forming the first insulation film, the first insulation film is formed to have a thickness of 30~80 Å.

5. The method according to claim 1, wherein, during the step of forming the polysilicon layer, the polysilicon layer is formed to have a thickness of approximately 1000 Å.

6. The method according to claim 1, wherein the step of forming the polysilicon layer comprises a low pressure chemical vapor deposition method.

7. The method according to claim 1, wherein during the step of forming the WNx film, the WNx film is formed to have a thickness of approximately 1000 Å.

8. The method according to claim 1, wherein during the step of forming the WNx film, the WNx film is formed by reactive sputtering in an atmosphere of a mixture of gases having the ratio of $N_2/(N_2+Ar)$ approximately equal to 0.4.

9. The method according to claim 1, further comprising the steps of:

forming a third insulation layer on the upper surface of the conductive line pattern and on the upper surface of the semiconductor substrate; and anisotropic-etching the third insulation layer, to form a side wall spacer at the side wall of the conductive line pattern.

10. The method according to claim 1, wherein, during the step of forming the WNx film, a content of N of the WNx film is in the range of 5~55%.

11. The method according to claim 1, wherein the step of selectively oxidizing the polysilicon layer includes simultaneously annealing the WNx film to change the WNx film to a W film.

12. A method for fabricating a semiconductor device, comprising the steps of:

forming an insulation film on the upper surface of a semiconductor substrate;

forming a polysilicon layer on the upper surface of the insulation film;

forming a WNx film on the upper surface of the polysilicon layer;

patterning the WNx film and the polysilicon layer to form a conductive line pattern; and simultaneously selectively oxidizing the polysilicon layer and annealing the WNx film to change the WNx film to a W film.

13. The method according to claim 12, wherein, in the step of forming the insulation film, the insulation film is formed to have a thickness of 30~80 Å.

14. The method according to claim 12, wherein, the step of forming the polysilicon layer includes forming the polysilicon layer to have a thickness of 1000 Å, and the step of forming the polysilicon layer refers to a low pressure chemical vapor deposition method.

15. The method according to claim 12, wherein in the step of forming the WNx film, the WNx film is formed to have a thickness of 1000 Å.

16. The method according to claim 12, wherein in the step of forming the WNx film, the WNx film is formed by a reactive sputtering at an atmosphere of mixture of gases that the ratio of $N_2/(N_2+Ar)$ is 0.4.

17. The method according to claim 13, wherein, in the step of forming the WNx film, a content of N of the WNx film is in the range of 5~55%.

18. The method according to claim 12, wherein, in the step of selectively oxidizing the polysilicon layer, the semiconductor substrate is thermally treated at a temperature of 800~1000° C. by using a mixture of gases of $H_2O/H_2$ or a carrier gas of argon or nitrogen.

19. The method according to claim 18, wherein a partial pressure ratio of the mixture of gases of $H_2O/H_2$ is in the range of $1\times10^{-6}$~10.

* * * * *